United States Patent
Chidambaram et al.

(10) Patent No.: US 7,348,232 B2
(45) Date of Patent: Mar. 25, 2008

(54) HIGHLY ACTIVATED CARBON SELECTIVE EPITAXIAL PROCESS FOR CMOS

(75) Inventors: Periannan Chidambaram, Richardson, TX (US); Srinivasan Charkravarthi, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/068,383

(22) Filed: Mar. 1, 2005

(65) Prior Publication Data

US 2006/0199285 A1    Sep. 7, 2006

(51) Int. Cl.
*H01L 21/8238* (2006.01)
(52) U.S. Cl. .................. 438/199; 438/224; 438/300; 257/E21.43; 257/E21.619
(58) Field of Classification Search .............. 438/14, 438/197, 199–202, 224–226, 300–308, 526, 438/576, 142; 257/E21.43, E21.619, E21.634
See application file for complete search history.

(56) References Cited

U.S. PATENT DOCUMENTS

| | | | | |
|---|---|---|---|---|
| 5,956,590 A | * | 9/1999 | Hsieh et al. | 438/303 |
| 5,994,747 A | * | 11/1999 | Wu | 257/408 |
| 6,187,641 B1 | * | 2/2001 | Rodder et al. | 438/299 |
| 6,946,350 B2 | * | 9/2005 | Lindert et al. | 438/285 |
| 2004/0248369 A1 | * | 12/2004 | Wang et al. | 438/305 |

* cited by examiner

*Primary Examiner*—Brook Kebede
(74) *Attorney, Agent, or Firm*—W. James Brady, III; Frederick J. Telecky, Jr.

(57) ABSTRACT

In accordance with the invention there is a method of forming a semiconductor device comprising forming a gate over a substrate, forming a source region and a drain region by doping a first portion and a second portion of active regions adjacent the gate, and forming a first recess in a portion of the source region and a second recess in a portion of the drain region. The method also includes activating the dopants in the source region and the drain region by heating the active regions and depositing a semiconductor material in the first recess and the second recess after activating the dopants in the source region and the drain region.

18 Claims, 6 Drawing Sheets

HIGHLY ACTIVATED CARBON SELECTIVE EPITAXIAL PROCESS FOR CMOS

DESCRIPTION OF THE INVENTION

1. Field of the Invention

The present invention relates generally to semiconductor devices and, more particularly, to transistors and associated methods of manufacture having improved mobility due to channel strain.

2. Background of the Invention

A conventional metal-oxide-semiconductor (MOS) transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus, the higher the mobility of the carrier in the channel, the more current can flow and the faster a circuit can perform. One way to increase the mobility of the carriers in the channel of an MOS transistor is to produce a mechanical stress in the channel.

A compressive strained channel has significant hole mobility enhancement over conventional devices. A tensile strained channel, such as a thin silicon layer grown on relaxed silicon germanium, achieves significant electron mobility enhancement. The most common method of introducing tensile strain in a silicon channel is to epitaxially grow the silicon channel layer on a relaxed silicon-germanium (SiGe), layer or substrate. The ability to form a relaxed SiGe layer is important in obtaining an overlying, epitaxially grown, silicon layer under biaxial tensile strain. However, the attainment of the relaxed SiGe layer can be costly and difficult to achieve.

Thus, there is a need to overcome these and other problems of the prior art and to provide a transistor with improved channel mobility.

SUMMARY OF THE INVENTION

In accordance with the invention there is a method of forming a semiconductor device comprising forming a gate over a substrate, forming a source region and a drain region by doping a first portion and a second portion of active regions adjacent the gate, and forming a first recess in a portion of the source region and a second recess in a portion of the drain region. The method also includes activating the dopants in the source region and the drain region by heating the active regions and depositing a semiconductor material in the first recess and the second recess after activating the dopants in the source region and the drain region.

In accordance with another embodiment there is a method of forming a semiconductor device comprising forming a gate on a substrate, forming a lightly doped source region and a lightly doped drain region in active regions adjacent the gate structure, and doping the active regions so as to form a source region and a drain region, wherein the lightly doped source region and the lightly doped drain region have a depth less than a depth of the source region and drain region. The method also includes forming a first recess in the source region and a second recess in the drain region, heating the source region and the drain region so as to form activated source and drain regions, and filling the first and second recesses in the activated source and drain regions with a semiconductor material.

According to another embodiment there is a method of forming a semiconductor device comprising forming a gate structure in a substrate, forming a first doped region and a second doped region in active regions adjacent the gate structure, and forming a third doped region and a fourth doped region in the active regions so as to form a source region and a drain region, respectively, wherein the first doped region and the second doped region have a depth less than the depth of the third doped region and the fourth doped region, respectively. The method also includes forming recesses in a portion of the source region and in a portion of the drain region, heating the active regions to form an activated source and an activated drain, and filling the recesses in the activated source and drain with a semiconductor material.

According to another embodiment there is a method of forming a semiconductor device comprising forming a gate over a substrate, forming a source region and a drain region adjacent to the gate, and forming a recess in the source region and in the drain region. The method also includes heating the source region and the drain region to form an activated source and an activated drain and filling the recesses in the activated source and the activated drain with a semiconductor material comprising a dopant.

According to another embodiment there is a semiconductor device comprising a gate structure over a substrate, a source and a drain adjacent the gate structure. The semiconductor device also includes a semiconductor material comprising at least 1% activated carbon formed in the source and in the drain and a silicide contacting a portion of the source and drain regions.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which are shown, by way of illustration, specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary methods for fabricating exemplary semiconductor devices having improved carrier mobility while minimizing defects normally associated with strained silicon devices in accordance with various embodiments of the invention will now be described. FIGS. 1A-1M illustrate an exemplary semiconductor device at various stages of fabrication. In addition, the methods according to the present embodiments can be implemented in association with the fabrication of IC's and composite transistors illustrated herein, as well as in association with other transistors and structures not illustrated, including but not limited to NMOS and/or PMOS composite transistors.

Figure 1A:
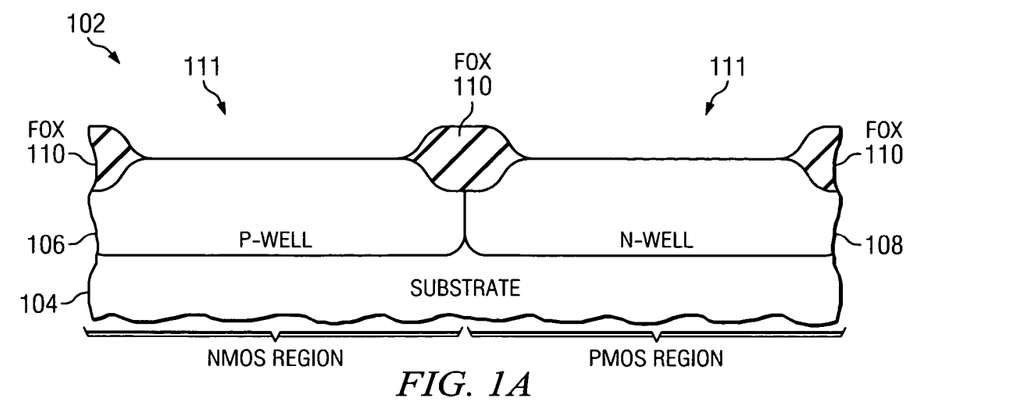
FIGS. 1A-1M are fragmentary cross sectional diagrams illustrating various steps of forming NMOS and PMOS transistors in accordance with various embodiments of the present invention.
Figure 1B:
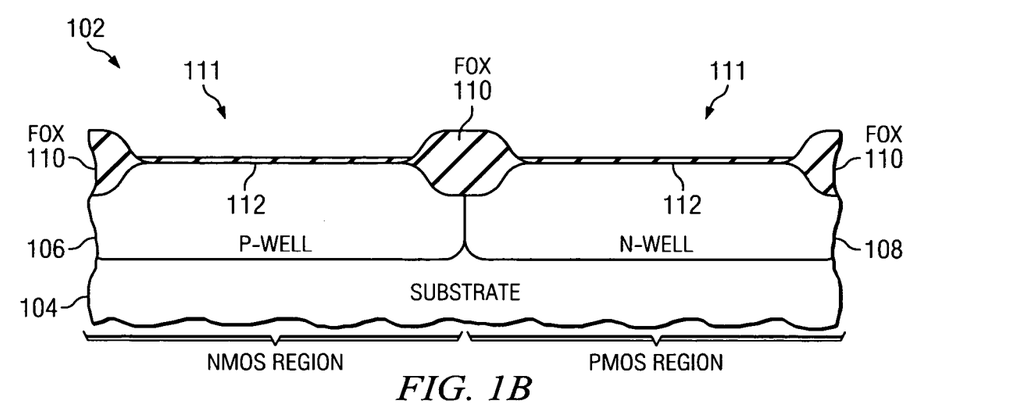

Turning now to FIGS. 1A-1M, a plurality of fragmentary cross section diagrams illustrating a transistor device being formed in accordance with the present invention are provided. In FIG. 1A, a transistor device 102 is provided, wherein a semiconductor body 104, such as a substrate, has a number of wells formed therein, such as a P-well 106 to define an NMOS transistor device region and an N-well 108 to define a PMOS transistor device region, respectively. Further, isolation regions 110, such as field oxide (FOX) or STI regions can be formed in the semiconductor body to define active area regions 111. In FIG. 1B, transistor device 102 is illustrated, wherein a gate dielectric 112 has been formed, for example by thermally grown $Si_2$, over the active area 111. However, other types of gate dielectrics (such as high-k dielectrics) can be formed and are contemplated by the various embodiments.

Figure 1C:
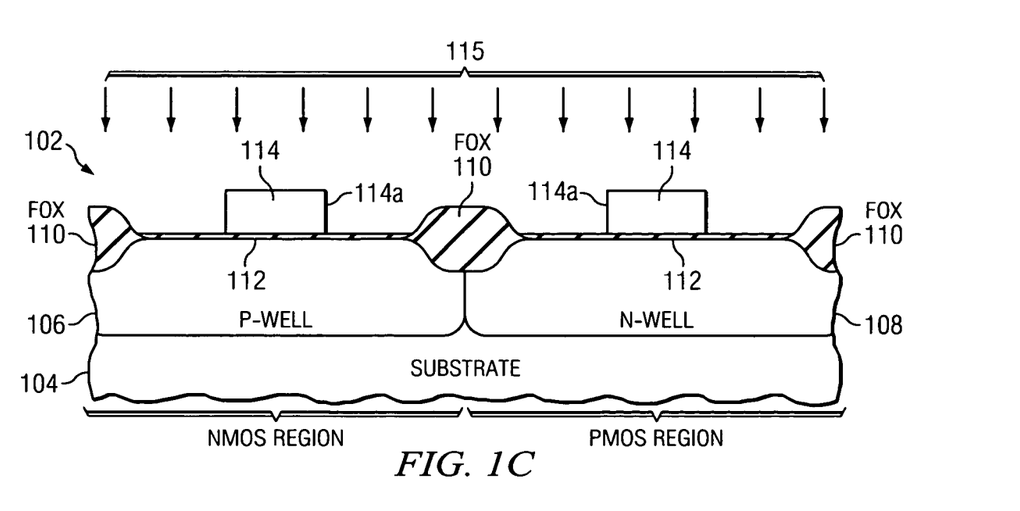
Figure 1D:
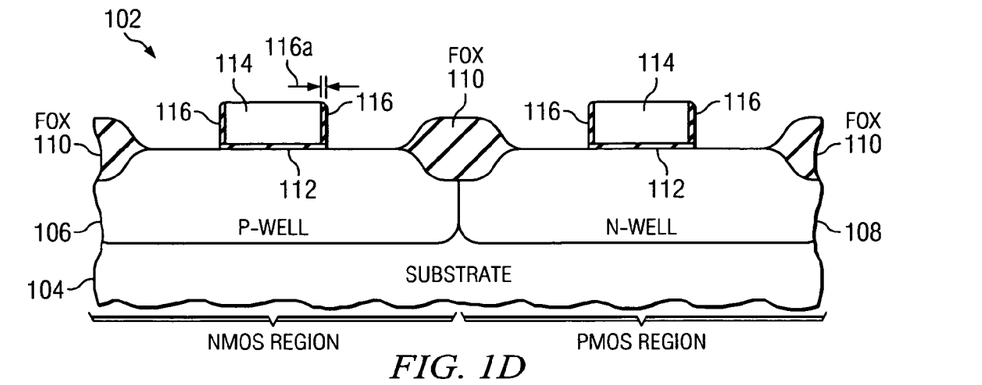

Referring to FIGS. 1C and 1D, a conductive gate electrode material, such as, for example, polysilicon, can be deposited and patterned by an etching process 115 to form a gate electrode 114 overlying the gate oxide 112. An offset spacer 116 can then be formed on the lateral edges 114a of the gate electrode, as seen in FIG. 1D, wherein the offset spacers can have a width 116a of about 10-50 nm.

Figure 1E:
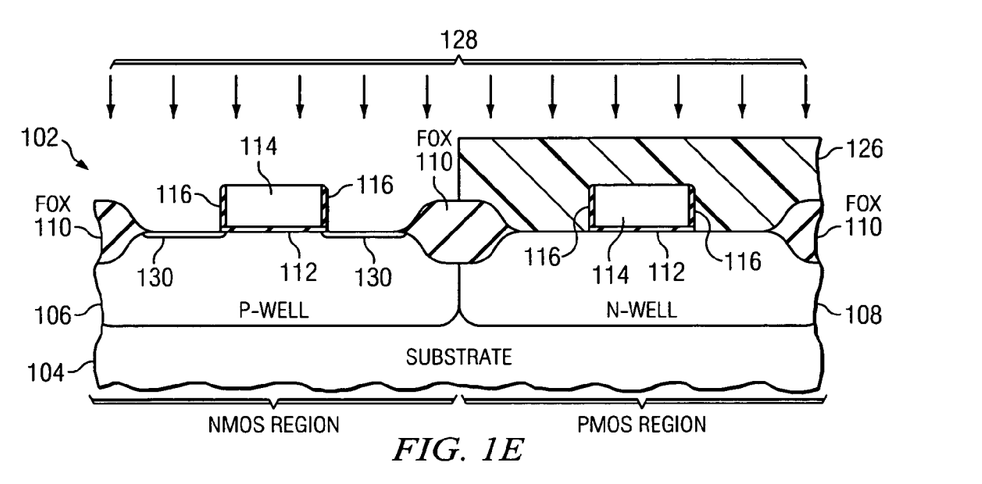

The PMOS region can then be masked off, as illustrated in FIG. 1E with a masking material 126 such as photoresist, and an extension region implant 128 can be performed to form n-type extension region 130 in the NMOS region. According to various embodiments, a thermal process, such as a rapid thermal anneal, can then be performed to activate the dopant, wherein lateral diffusion of the extension regions 130 under the offset spacer 116 is achieved. Exemplary temperatures for activating dopants are from about 650° C. to about 1050° C. In certain embodiments, the temperature can be about 950° C. and in still further embodiments, the temperature can be about 1050° C. At these temperatures, there is amorphous layer re-growth.

Figure 1F:
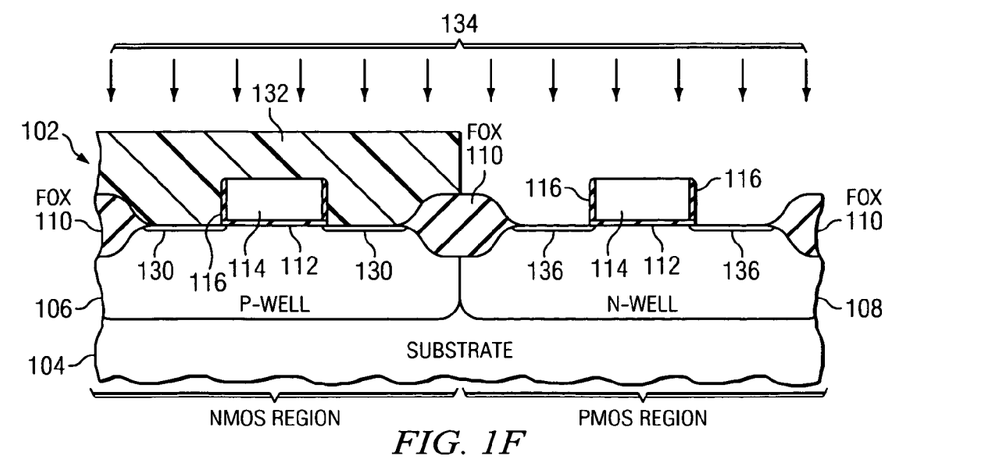

The p-type extension region mask 126 can then be removed, and an n-type extension region mask 132 can be deposited and patterned to cover the NMOS region, as illustrated in FIG. 1F. A p-type extension region implant process 134 can then be performed to form p-type extension regions 136 in the PMOS region, as illustrated.

Figure 1G:
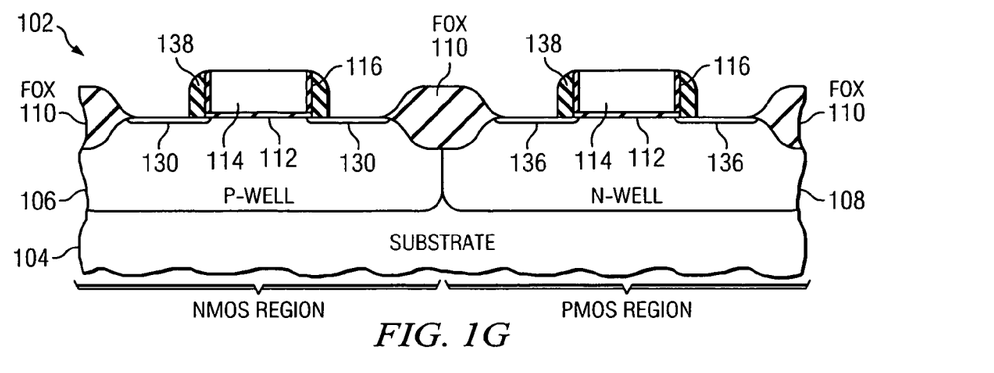

The mask 132 can then be removed and dummy sidewall spacers 138 can be formed adjacent offset spacers 116 on the lateral edges of the gate structures. For example, an insulating sidewall material can be deposited in a generally conformal manner over the device and subsequently subjected to an anisotropic etch to remove the insulating material on top of the gate and over the active areas, leaving dummy sidewall spacers 138 in both the NMOS and PMOS regions, as illustrated in FIG. 1G. Exemplary materials used for the dummy sidewall spacers 138 include various oxides and nitrides, such as silicon oxides, silicon nitrides, and silicon oxynitrides. However, other acceptable materials can also be used.

Figure 1H:
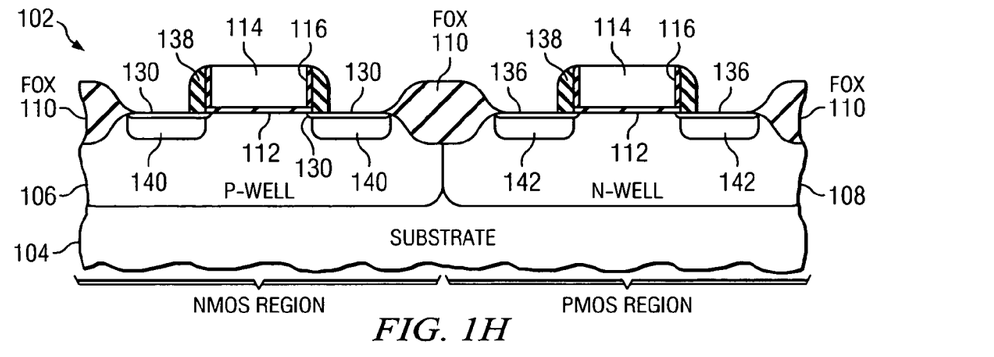
Figure 1I:
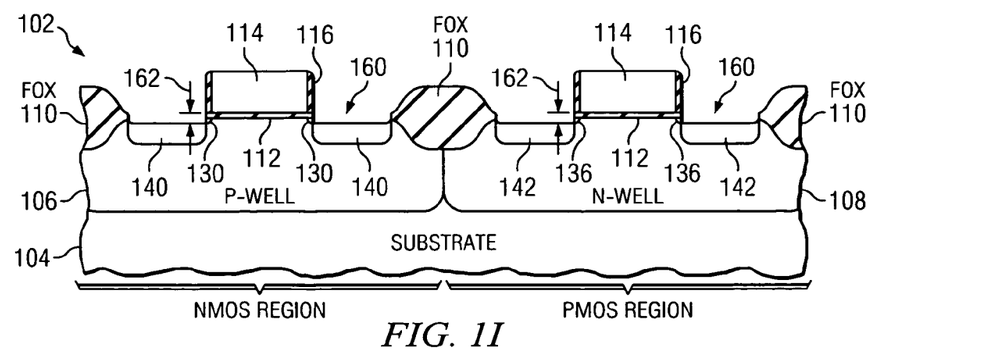

Source and drain regions 140 and 142 can then be formed in the NMOS and PMOS regions respectively, as shown in FIG. 1H. As discussed above in conjunction with the extension region implants, the source/drain implants can be performed with a n-source/drain mask (not shown) and a p-source/drain mask (not shown) in order to implant the NMOS region and the PMOS region separately with n-type and p-type dopant, respectively. As can be seen in FIG. 1H, the source/drain regions 140 and 142 are self-aligned with respect to the dummy sidewall spacers, and thus are laterally spaced from the extension regions 130 and 136, respectively.

A thermal process, such as a rapid thermal anneal, can then be employed to activate source and drain regions 140 and 142. Moreover, in various embodiments a single thermal process can be employed to activate the source and drain regions 140 and 142 and the extension regions 130 and 136. The thermal process causes the extension regions 130 and 136 to diffuse laterally slightly beneath the offset spacers toward the channels. Exemplary temperatures for activating source and drain regions are from about 650° C. to about 1050° C. In certain embodiments, the temperature can be about 950° C. and in still further embodiments, the temperature can be about 1050° C.

As shown in FIG. 1, dummy sidewall spacers 138 can be removed by known etching techniques. Recesses 160 can then be formed in the areas extending between the gate structure and the isolation regions, as shown in FIG. 1J. The area where the recesses are formed can include the active regions of the silicon body where extension regions 130 and 136 and source and drain regions 140 and 142 are formed. Recesses 160 can be formed using, for example, a dry etching technique such as the chemistry employed to etch the STI trenches in the semiconductor body when forming isolation regions. According to various embodiments, the recesses can extend into the semiconductor body to a depth 162 of about 10 nm to about 90 nm, and more particularly, to a depth of about 30 nm to about 70 nm. According to various embodiments, the depth of recesses 160 less than the depth of the sources and drains 140 and 142. In certain embodiments, the gate structure is not masked during the recess formation. As such, when the gate electrode comprises polysilicon, the recess formation process can also result in a recess formed in a top portion of the gate electrode material (not shown).

Figure 1J:
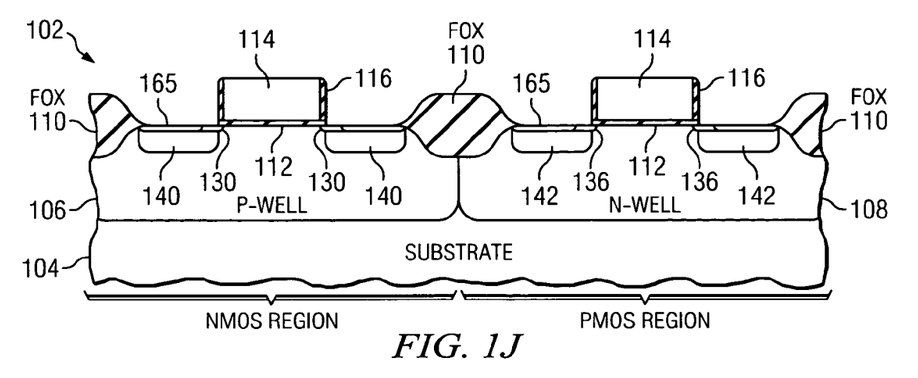
Figure 1K:
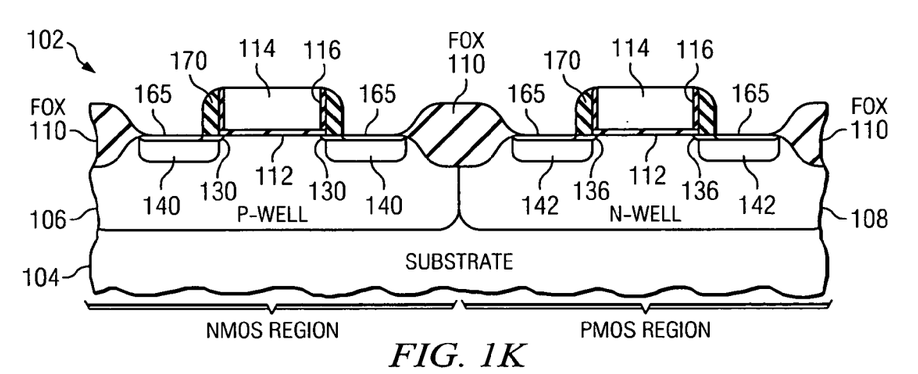

According to various embodiments, recesses 160 can extend across various portions of the source and drain regions and across various portions of extension regions 130 and 136. For example, recesses 160 can extend across the entire extent of the source and drain regions and/or the entire extent of extension regions 130 and 136. Alternatively, recesses 160 can extend across a portion of the source and drain regions and/or a portion of extension regions 130 and 136.

As shown in FIG. 1J recesses 160 can then be filled with a semiconductor material 165. According to various embodiments, semiconductor material 165 can comprise silicon and carbon (Si:C), silicon germanium, or a semiconductor having a lattice spacing different than the lattice spacing of the surrounding material. For example, a strained Si:C layer can be formed in recesses 160. Silicon can be selectively deposited in recesses 160 by various techniques and carbon can be introduced into the silicon deposited in recesses 160 by masking and ion implanting or high dose gas cluster ion beam deposition. Because the silicon is selectively deposited, there is no silicon on unwanted areas, such as the field oxide.

While not intending to be limited to any one theory, it is believed that the semiconductor material 165, such as Si:C or silicon germanium within the recesses forms an alloy that has a lattice with the same structure as the silicon body lattice, however, the semiconductor material 165 has a larger spacing. As a result, it is believed that the semiconductor material 165 within the recesses creates a compressive stress within the channel of the semiconductor body underneath the gate.

According to various embodiments, semiconductor material 165 can be deposited in recesses 160 after the dopants of the source and drain have been activated. Accordingly, the semiconductor material 165 is not exposed to high temperature anneals. While not intending to be limited to any one theory, it is believed that in the case of Si:C filling recesses 160, high temperature annealing could affect the Si:C lattice parameter. For example, in the as-formed Si:C, a relatively large percentage of carbon resides in substitutional sites in the silicon. However, it is difficult to keep the carbon in an active site because of the low solubility of carbon in silicon.

For example, carbon typically does not activate in silicon beyond about 0.2%. Further, amorphization and regrowth with traditional flow activates carbon in silicon to a maximum of about 0.7%. However, when the as-formed Si:C is exposed to low temperature annealing, e.g., below about 700° C., carbon can be activated to $\geq 1\%$. Therefore, it is believed that exposing the as-formed Si:C to a high temperature anneal or a high thermal budget, such as that used to activate the source and drains, causes carbon to move from the substitutional site to an interstitial site in the silicon. High temperature annealing relaxes the strain and the added mobility in the as-deposited system is significantly reduced.

Figure 2A:
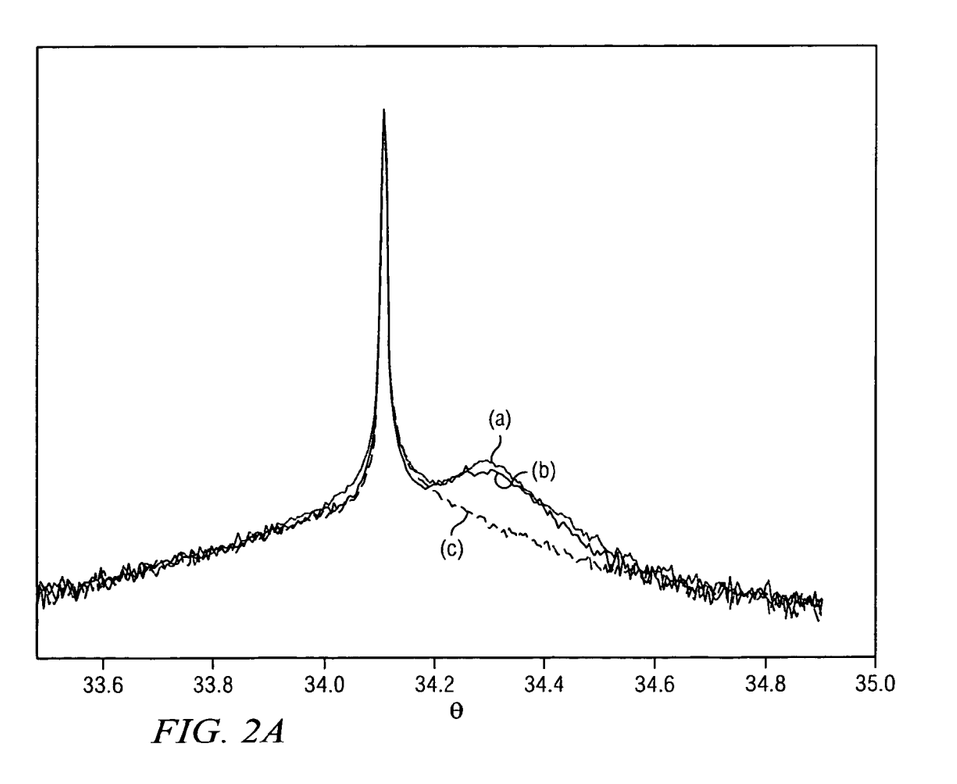
FIGS. 2A-2B are exemplary x-ray diffractograms of various materials exposed to different annealing temperatures.
Figure 2B:
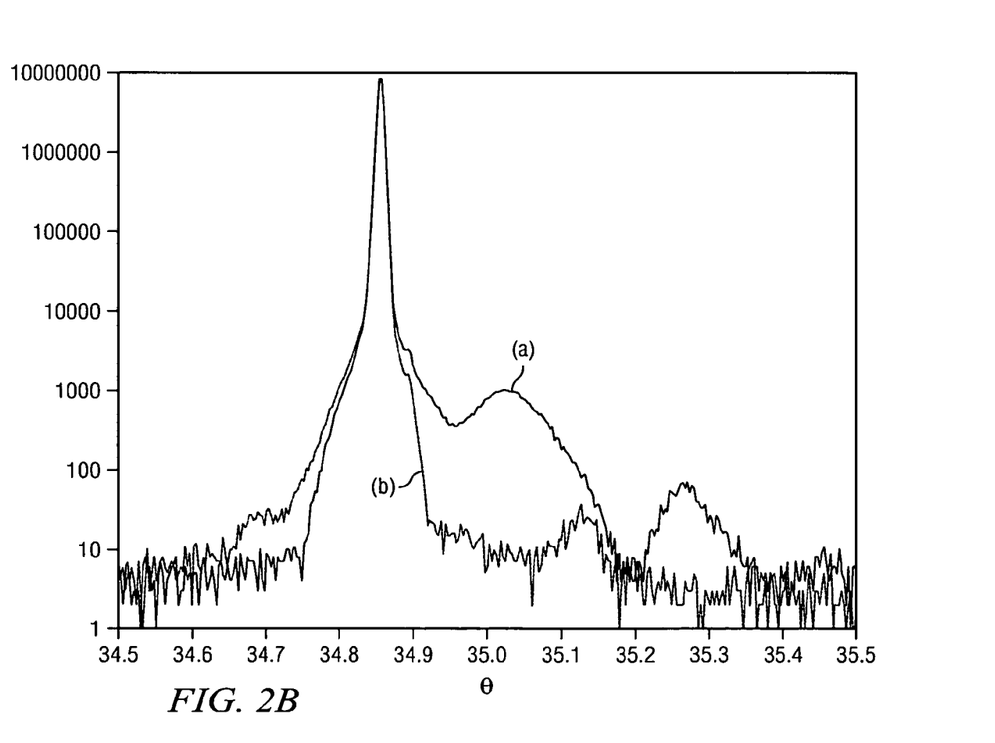

Lattice parameter analysis has been used to determine the doping concentration in the semiconductor material. Results of this analysis can be seen in FIGS. 2A and 2B. FIGS. 2A and 2B show x-ray diffractograms of silicon and Si:C exposed to different annealing temperatures. The Si:C shown in FIG. 2A was formed and subsequently exposed to a temperature of 1050° C., which is similar to the source/drain activation temperature. The activation of carbon in Si:C for various implantation schemes and various annealing conditions were measured as shown in FIG. 2A. As can be see in curves (a) and (b) in FIG. 2A, the maximum carbon activation is only 0.7%. Further, as shown by curve (c) in FIG. 2A, the carbon activation is less than 0.7% for higher annealing temperatures.

In contrast, the Si:C of FIG. 2B was formed and subsequently exposed to a temperature of 700° C., representing a temperature that a device would be exposed to after source/drain activation. As shown by curve (a) of FIG. 2B, carbon in the Si:C of FIG. 2B is activated to 1.1%.

Figure 1L:
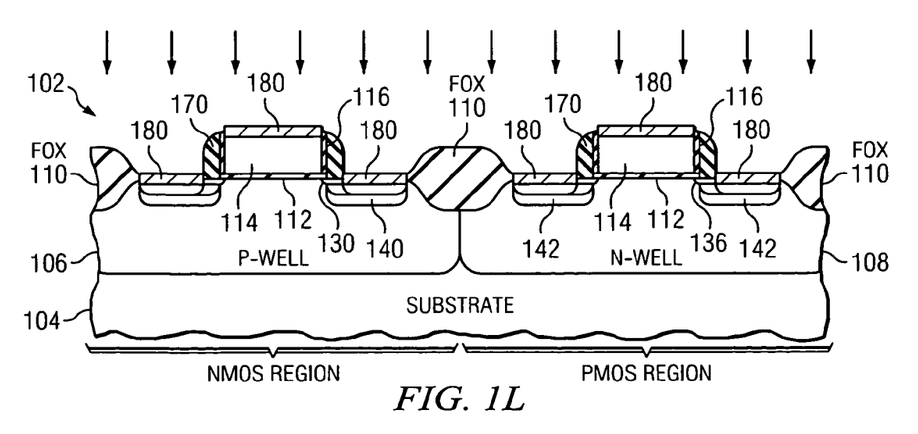

As shown in FIG. 1L, after filling recesses with semiconductor material 165, sidewall spacers 170 can be formed. Sidewall spacers 170 comprise an insulating material such as an oxide, a nitride, or a combination of such layers. The sidewall spacers are formed by depositing a layer of such spacer material(s) over the device in a generally conformal manner, followed by an anisotropic etch, thereby removing such spacer material from the top of the gate electrode 114 and from the active areas 111 and leaving a region on the lateral edges of the gate electrode, overlying the offset spacers 116. Sidewall spacers 170 can be substantially thicker than offset spacers 116 and can be formed over portions of semiconductor material 165.

Figure 1M:
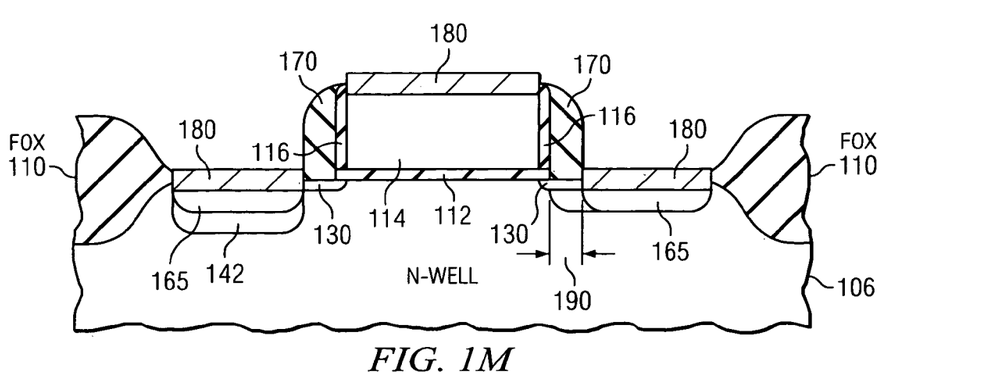

According to various embodiments, as shown for example in FIG. 1M, a silicide 180 can then be formed. For example, a metal layer can be deposited, for example, by sputtering, followed by a thermal process. During the thermal process, those regions where metal contacts silicon reacts to form a metal silicide. More particularly, the silicide can form on the source/drain regions and on top of the gates. Unreacted metal is then stripped away, and back end processing such as interlayer dielectric and metallization layers are formed so as to conclude the device formation.

The methods described herein form the semiconductor material close to the channel region of the transistor device, only offset from the lateral edge of the gate electrode 114 by about 5 nm to about 20 nm. By residing closer to the channel, the semiconductor material 165 more efficiently transfers the desired stress to the channel. Conventional processes form the stress inducing materials before activating the source/drain dopants, thereby reducing the amount of activated material, such as carbon, in the semiconductor material.

Looking now at FIG. 1M, an enlarged view of the resulting PMOS transistor fabricated in accordance with various embodiments of the invention is illustrated. Note in this embodiments that the semiconductor material 165 is spaced from the channel by a distance 190, which is no more than the thickness of offset spacer 116. Having the semiconductor material close to the channel provides for a substantial improvement over the prior art in that compressive stress is imparted to the channel.

According to various alternative embodiments, a CMOS device may be fabricated with only one of the PMOS or NMOS transistors having the semiconductor material 165 formed adjacent to the channel. For example, a CMOS device may be fabricated such that only the NMOS transistor has recesses 160 filled with semiconductor material 165 so as to impart stress into the channel. Alternatively, a CMOS device may be fabricated such that only the NMOS transistor has recesses 160 filled with semiconductor material 165 so as to impart stress into the channel.

The invention is described above with respect to the use of carbon and germanium to form SiC and silicon germanium lattice structures. However, the present invention contemplates the use of any element that will create an alloy with silicon and serve to impart a compressive stress to the channel of the MOS device, such as the PMOS device, and such alternatives are contemplated as falling within the scope of the present invention.

While the invention has been illustrated with respect to one or more implementations, alterations and/or modifications can be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless indicated, to any component or structure which performs the specified function of the desired component (e.g., that is functionally equivalent), even though not structurally equivalent to the disclosed structure which performs the function in the herein illustrated exemplary embodiments of the invention. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising".

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device comprising:
   forming a gate over a substrate;
   forming a source region and a drain region by doping a first portion and a second portion of active regions adjacent the gate;
   forming a first recess in the source region and a second recess in the drain region;
   activating the dopants in the source region and the drain region by heating the active regions; and
   depositing a semiconductor material in the first recess and the second recess after activating the dopants in the source region and the drain region, wherein the semiconductor material comprises activated carbon.

2. The method of forming a semiconductor device according to claim 1 further comprising:
   doping a third portion and a fourth portion of the active regions, wherein the third portion and the fourth portion have a depth less than a depth of the first and second doped portions.

3. The method of forming a semiconductor device according to claim 1, wherein depositing the semiconductor material in the recess further comprises at least one of selective epitaxy, ion implantation, and high dose gas cluster ion beam deposition.

4. The method of forming a semiconductor device according to claim 1 wherein the first and the second recesses are offset from a sidewall of the gate by 5 nm to 30 nm.

5. The method of forming a semiconductor device according to claim 1, wherein the first and the second recesses have a depth from 30 nm to 60 nm.

6. The method of forming a semiconductor device according to claim 1, wherein the semiconductor device is an NMOS transistor.

7. The method of forming a semiconductor device according to claim 1, wherein heating the active regions comprises heating at a temperature greater than about 950° C.

8. The method of forming a semiconductor device according to claim 1, wherein the semiconductor material comprises at least 1% activated carbon.

9. The method of forming a semiconductor device according to claim 1, wherein the semiconductor material deposited in the first and the second recesses forms a strained region with respect to the surrounding source region and drain region, respectively.

10. A method of forming a semiconductor device comprising:
    forming a gate over a substrate;
    forming a lightly doped source region and a lightly doped drain region in active regions adjacent the gate structure;
    doping the active regions so as to form a source region and a drain region, wherein the lightly doped source region and the lightly doped drain region have a depth less than a depth of the source region and drain region;
    forming a first recess in the source region and a second recess in the drain region recesses in the source region and the drain region;
    heating the source region and the drain region so as to form activated source and drain regions;
    filling the first and second recesses in the activated source and drain regions with a semiconductor material, wherein the semiconductor material comprises activated carbon.

11. The method of forming a semiconductor device according to claim 10, wherein doping the active regions so as to form a source region and a drain region further comprises:
    forming a first disposable sidewall spacer on a first sidewall of the gate and forming a second disposable sidewall spacer on a second sidewall of the gate, wherein the first and second disposable sidewall spacers inhibit dopants from reaching a portion of the active areas.

12. The method of forming a semiconductor device according to claim 10, wherein filling the recesses comprises at least one of selective epitaxy, ion implantation, and high dose gas cluster ion beam deposition.

13. The method of forming a semiconductor device according to claim 10, wherein the recesses are adjacent and offset from the sidewalls of the gate by about 5 nm to about 30 nm.

14. The method of forming a semiconductor device according to claim 10, wherein activating the source region and the drain region comprises heating at a temperature greater than about 950° C.

15. The method of forming a semiconductor device according to claim 10, wherein the semiconductor material comprises at least 1% activated carbon.

16. The method of forming a semiconductor device according to claim 10, wherein the filled first and second recesses form a strained region with respect to the surrounding source and drains.

17. A method of forming a semiconductor device comprising:
    forming a gate structure in a substrate;
    forming a first doped region and a second doped region in active regions adjacent the gate structure;
    forming a third doped region and a fourth doped region in the active regions so as to form a source region and a drain region, respectively, wherein the first doped region and the second doped region have a depth less than the depth of the third doped region and the fourth doped region, respectively;
    forming recesses in a portion of the source region and in a portion of the drain region;

heating the active regions so as to form an activated source and an activated drain;

filling the recesses in the activated source and drain with a semiconductor material, wherein the semiconductor material comprises activated carbon.

18. A method of forming a semiconductor device comprising:

forming a gate over a substrate;

forming a source region and a drain region adjacent to the gate;

forming a recess in the source region and in the drain region;

heating the source region and the drain region to form an activated source and an activated drain;

filling the recesses in the activated source and the activated drain with a semiconductor material comprising a dopant, wherein the dopant comprises activated carbon.

* * * * *